United States Patent
Su

(10) Patent No.: US 7,777,550 B1
(45) Date of Patent: Aug. 17, 2010

(54) HIGH BOOSTING-RATIO/LOW-SWITCHING-DELAY LEVEL SHIFTER

(75) Inventor: Jason Su, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/392,021

(22) Filed: Feb. 24, 2009

Related U.S. Application Data

(60) Provisional application No. 61/040,945, filed on Mar. 31, 2008.

(51) Int. Cl.
*H03L 5/00* (2006.01)
(52) U.S. Cl. .............................. 327/333; 326/63; 326/81
(58) Field of Classification Search ............. 326/62–63, 326/80–81; 327/306, 333
See application file for complete search history.

(56) References Cited

U.S. PATENT DOCUMENTS

| | | | |
|---|---|---|---|
| 7,151,400 B2 * | 12/2006 | Chen | 327/333 |
| 7,199,617 B1 | 4/2007 | Schrom et al. | |
| 7,215,146 B2 * | 5/2007 | Khan | 326/83 |
| 7,348,800 B2 | 3/2008 | Koto et al. | |
| 7,348,801 B2 | 3/2008 | Nojiri | |

OTHER PUBLICATIONS

Behnam Amelifard et al, "Enhancing the Efficiency of Cluster Voltage Scaling Technique for Low-power Application", ISCAS 2005 IEEE International Symposium on Circuits and Systems, May 23-26, 2005, Kobe, Japan.

* cited by examiner

*Primary Examiner*—Dinh T. Le

(57) ABSTRACT

A circuit receives an input signal characterized by a first pair of rail voltages and generates in response thereto an output signal characterized by a second pair of rail voltages. The circuit comprises first and second transistors coupled in series between a high reference voltage and a low reference voltage. The input signal drives a control lead of the second transistor. The logical inverse of the input signal drives a control lead of a third transistor, which couples a charge source to the control lead of the first transistor in response thereto in order to turn off the first transistor. The charge source can be either a voltage source or a charged capacitive node. Of importance, the third transistor does not have to overcome contention with other transistors to turn off said first transistor.

21 Claims, 5 Drawing Sheets

HIGH BOOSTING-RATIO/LOW-SWITCHING-DELAY LEVEL SHIFTER

CROSS REFERENCE TO RELATED APPLICATIONS

This application claims priority based on provisional patent application 61/040,945, filed Mar. 31, 2008, the entire disclosure of which is incorporated herein by reference.

BACKGROUND

This application pertains to circuits and methods for shifting voltage levels of a signal.

It is known in the art to have a first portion of an electronic system use a first set of rail (e.g., power supply) voltages to communicate digital signals and a second portion of the system use a second set of rail voltages to communicate digital signals. Such a system typically comprises level shifter circuits to shift the voltage levels of signals from the first set of rail voltages to the second set of rail voltages so that the first portion of the system can communicate with the second portion of the system. FIG. 1A illustrates a prior art level shifter circuit 1 for receiving input signals IN1 and IN1' having a first pair of rail voltage values and generating therefrom output signals OUT1 and OUT1' having a second pair of rail voltages. (As used herein, signal IN1' is the logical inverse of signal IN1 and signal OUT1' is the logical inverse of signal OUT1. The apostrophe indicates a logical inverse.)

Signals IN1 and IN1' are characterized by rail voltages VSS and VDDL (0 and 0.7 volts, for example), and signals OUT1 and OUT1' are characterized by rail voltages VSS and VDDH (0 and 1.2 volts, for example). When signal IN1 is high, transistor T1 is on, signal OUT1' is low, transistor T4 is on, and signal OUT1 is high. When signal IN1 is low, the opposite is true.

FIG. 1B illustrates a second prior art circuit 2 for receiving signals IN1 and IN1' and converting them to output signals OUT1 and OUT1'. There are several problems with circuits 1 and 2.

Regarding circuit 1, signal IN1 transitions from VSS to VDDL and signal IN1' transitions from VDDL to VSS. Prior to this transition, transistors T1 and T4 are off, transistors T2 and T3 are on, signal OUT1' is high (i.e. at voltage VDDH), and signal OUT1 is low. At the time of transition, signal IN1 turns on transistor T1, pulling signal OUT1' low and thereby turning on transistor T4. Eventually, the voltage at OUT1 rises to voltage VDDH and turns off transistor T3. Unfortunately, there is a time window during which transistors T2 and T4 are both on, which results in contention. The contention slows the completion of switching and draws excess current and therefore consumes excess power. A similar window occurs in transistors T1 and T3 when signal IN1 transitions from voltage VDDL to voltage VSS and signal IN1' transitions from voltage VSS to voltage VDDL.

If the high voltage of signal OUT1 (i.e. VDDH) is much larger than the high voltage of signals IN1 and IN1' (voltage VDDL), transistor T1 becomes weaker than transistor T3. At some point, transistor T1 will be unable to resolve the contention, and will fail to pull signal IN1' sufficiently low. This mechanism sets operation limits of circuits 1 and 2. Thus, one important feature of a successful level shifter design is to accommodate a high VDDH to VDDL ratio. Another important feature of a level shifter design is to minimize contention between the pull-up PMOS transistors T3 and T4 and the pull-down NMOS transistors T1 and T2, and cause the level shifter circuit to latch as quickly as possible. Thus, it would be desirable to pull signal OUT1 high to turn off transistor T3 more quickly to minimize switching delay and switching current. It is also desirable to minimize DC current.

Circuit 2 also exhibits problems. For example, when signal IN1 is high, both transistors T5 and T7 are on, thereby causing circuit 2 to draw excessive current and consume excessive power.

SUMMARY

A circuit constructed in accordance with an embodiment of the invention converts an input signal characterized by a first pair of rail voltages to an output signal characterized by a second pair of rail voltages.

The present invention includes a circuit for converting an input signal characterized by a first pair of rail voltages to an output signal characterized by a second pair of rail voltages. In one embodiment, the circuit comprises an input lead for receiving said input signal, first and second transistors coupled in series between a first voltage supply lead and a second voltage supply lead, and third and fourth transistors coupled in series between said first voltage supply lead and said second voltage supply lead. A control lead of said third transistor may be coupled to a first node between said first and second transistors, and a control lead of said first transistor may be coupled to a second node between said third and fourth transistors. The second transistor turn on in response to said input signal transitioning from a first level to a second level, and the fourth transistor turns on in response to said input signal transitioning from the second level to the first level. The circuit further includes a fifth transistor for coupling the control lead of said third transistor to a first charge source to turn off the third transistor when the input signal transitions from said second level to said first level, and a sixth transistor for coupling the control lead of said first transistor to a second charge source to turn off the first transistor when the input signal transitions from said first level to said second level.

In one embodiment, the circuit further comprises an inverter having an input coupled to the input lead and further coupled to a control lead of the second transistor. An output of the inverter is coupled to a control lead of the fourth transistor.

In one embodiment, the fifth transistor has a first terminal coupled to the control lead of the third transistor, a second terminal coupled to the first charge source, and a control lead coupled to the input signal. Furthermore, in one embodiment, the sixth transistor has a first terminal coupled to the control lead of the first transistor, a second terminal coupled to the second charge source, and a control lead coupled to an inverse of the input signal.

In one embodiment, the first and second charge sources each comprise capacitances.

In one embodiment, the first charge source comprises an MOS transistor having a gate coupled to the second terminal of the fifth transistor and a source terminal and a drain terminal coupled to a first voltage, and wherein the second charge source comprises an MOS transistor having a gate coupled to the second terminal of the sixth transistor and a source terminal and a drain terminal coupled to a second voltage.

In one embodiment, the fifth transistor has a first terminal coupled to the control lead of the third transistor, a second terminal coupled to a rail voltage, and a control lead coupled to the input signal, and wherein the sixth transistor has a first terminal coupled to the control lead of the first transistor, a second terminal coupled to the rail voltage, and a control lead coupled to an inverse of the input signal.

In one embodiment, the fifth transistor has a first terminal coupled to the control lead of the third transistor, a second terminal coupled to a rail voltage, and a control lead coupled to an inverse of the input signal, and wherein the sixth transistor has a first terminal coupled to the control lead of the first transistor, a second terminal coupled to the rail voltage, and a control lead coupled to the input signal.

In one embodiment, the fifth transistor couples a first capacitive node to the control lead of said third transistor, and the sixth transistor couples a second capacitive node to the control lead of said first transistor, said first capacitive node being charged through said fifth and first transistors when the fifth and first transistors are on, said second capacitive node being charged through said sixth and third transistors when said sixth and third transistors are on.

In one embodiment, the fifth transistor couples said first voltage supply lead to the control lead of said third transistor, and the sixth transistor couples the said first voltage supply lead to the control lead of said first transistor.

In one embodiment, the circuit further comprises a first inverter for receiving a first voltage at said first node and providing a first output signal at a first output lead, a second inverter for receiving a second voltage at said second node and providing a second output signal at a second output lead, and a third inverter for receiving said input signal, said third inverter controlling said fourth transistor, said input signal controlling said second transistor.

In one embodiment, the first and third transistors have a first conductivity type and the second and fourth transistors have a second conductivity type.

In one embodiment, the fifth and sixth transistors have said first conductivity type.

In one embodiment, the fifth and sixth transistors have said second conductivity type.

In one embodiment, the first pair of rail voltages comprise a first low voltage and a first high voltage and the second pair of rail voltages comprise a second low voltage and a second high voltage, wherein the first low voltage of said first pair of rail voltages equals the second low voltage of the second pair of rail voltages, the first high voltage of said first pair of rail voltages is less than the second high voltage of the second pair of rail voltages, wherein the first voltage supply lead receives the second high voltage of the second pair of rail voltages, and the second voltage supply lead receives the second low voltage of the second pair of rail voltages.

In another embodiment, the present invention includes a system comprising the level shift circuits described herein, where system further comprising first circuitry using signals characterized by said first pair of rail voltages and second circuitry using signals characterized by said second pair of rail voltages, wherein said circuit permits said first circuitry to communicate a signal to said second circuitry.

In another embodiment, the present invention includes a method of level shifting a signal comprising receiving an input signal, the input signal transitioning from a first voltage to a second voltage, on a transition of the input signal from the first voltage to the second voltage, activating a second transistor, wherein the second transistor is coupled in series with a first transistor between a first high voltage rail and a first low voltage rail, deactivating a fourth transistor, wherein the fourth transistor is coupled in series with a third transistor between the first high voltage rail and the first low voltage rail, wherein a control lead of the third transistor is coupled to a first node between said first and second transistors and a control lead of the first transistor is coupled to a second node between the third and fourth transistors, and activating a sixth transistor, the sixth transistor coupling the control lead of the first transistor to a second charge source, and in accordance therewith, turning off said first transistor, and on a transition of the input signal from the second voltage to the first voltage, activating the fourth transistor, deactivating the second transistor, and activating a fifth transistor, the fifth transistor coupling the control lead of the third transistor to a first charge source, and in accordance therewith, turning off said third transistor.

In one embodiment, the first charge source comprises a first capacitance, wherein a voltage on the first charge source is stored on the first capacitance when said input signal is at said first voltage, and wherein the second charge source comprises a second capacitance, wherein a voltage on the second charge source is stored on the second capacitance when said input signal is at said second voltage.

In one embodiment, the first and second charge sources are the first high voltage rail or a second high voltage rail less than said first high voltage rail.

In one embodiment, the sixth transistor is activated by the input signal and wherein the fifth transistor is activated by an inverse of the input signal.

In one embodiment, the fifth transistor is activated by the input signal and wherein the sixth transistor is activated by an inverse of the input signal.

In one embodiment, the second voltage is equal to a second high voltage rail, and wherein first high voltage rail is greater than the second high voltage rail.

The following detailed description and accompanying drawings provide a better understanding of the nature and advantages of the present invention.

DETAILED DESCRIPTION

Figure 1A:
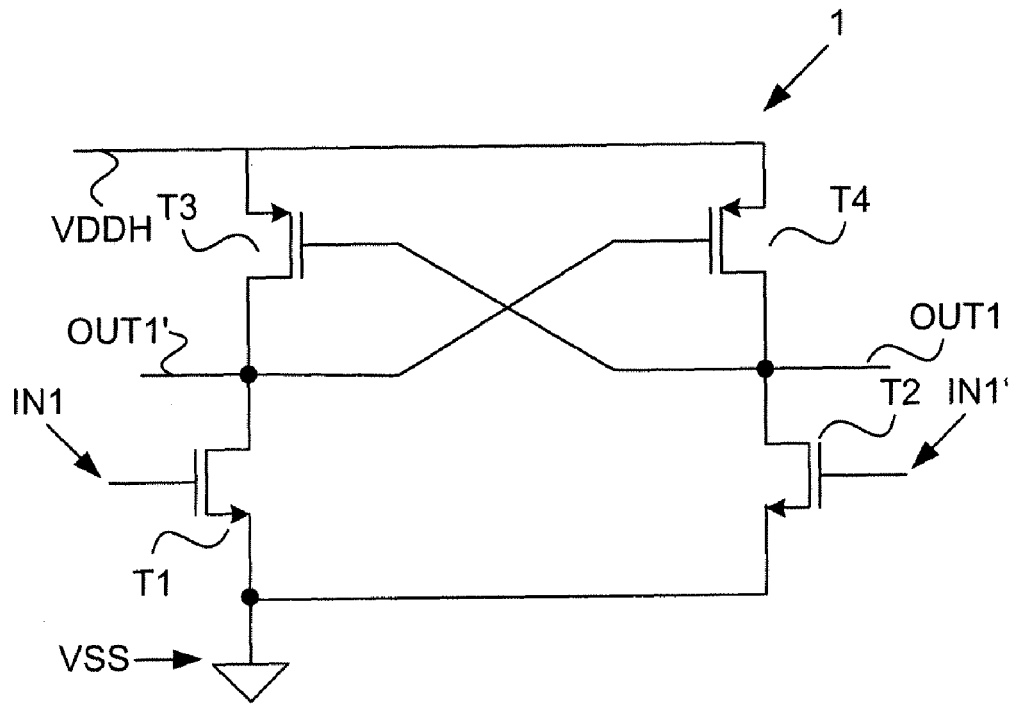
FIGS. 1A and 1B illustrate first and second prior art level shifter circuits.
Figure 1B:
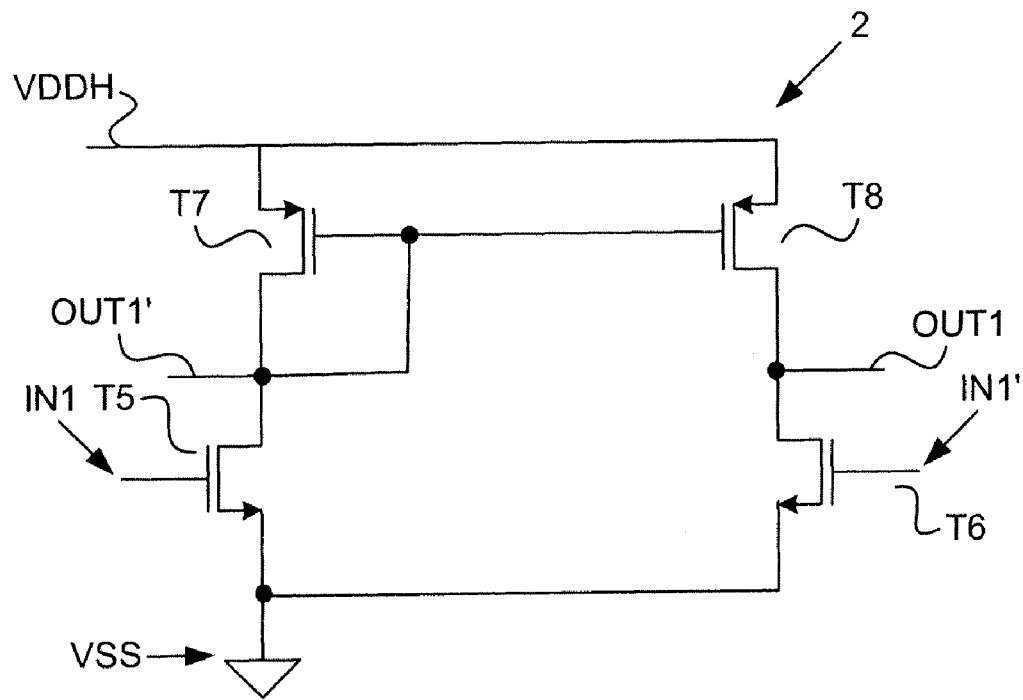
Figure 2:
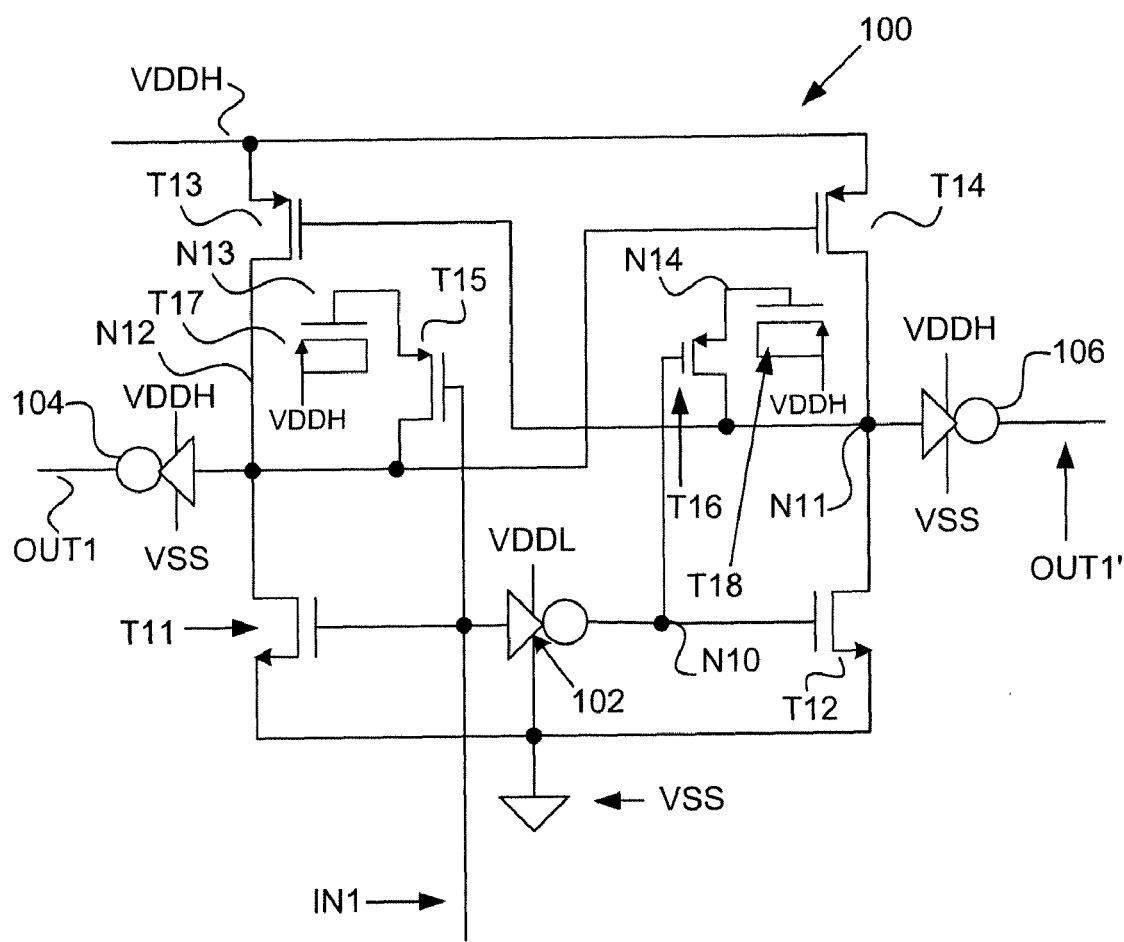
FIG. 2 illustrates a circuit constructed in accordance with a first embodiment of the invention using P channel pull-up transistors, N channel pull-down transistors, and P channel transistors for coupling charge sources to the control leads of the P channel pull-up transistors.

FIG. 2 schematically illustrates a circuit 100 which receives an input signal IN1 characterized by rail voltages VSS and VDDL and generates therefrom an output signal OUT1 (logically equal to signal IN1) characterized by rail voltages VSS and VDDH and an output signal OUT1' (the logical inverse of signal OUT1) also characterized by rail voltages VSS and VDDH. In one embodiment, VSS is ground, VDDL may be in the range of 1.1-0.9 volts with a typical value of 0.8 volts, and VDDH may be in the range of 1.2-0.0 volts with a typical value of 1.2 volts, for example. When a signal is at voltage VSS, it is typically considered a logical zero or low. When a signal is at voltage VDDL or VDDH, it is typically considered a logical one or high.

Of importance, the DC power consumption of circuit 100 is limited by virtue of the fact that there are no DC paths between VDDH and VSS or between VDDL and VSS that simultaneously conduct. Also, the timing of the change of state of circuit 100 does not depend upon a pull-up transistor overcoming a pull-down transistor or vice versa.

State of Circuit 100 Prior to Time TIME1

Figure 3:
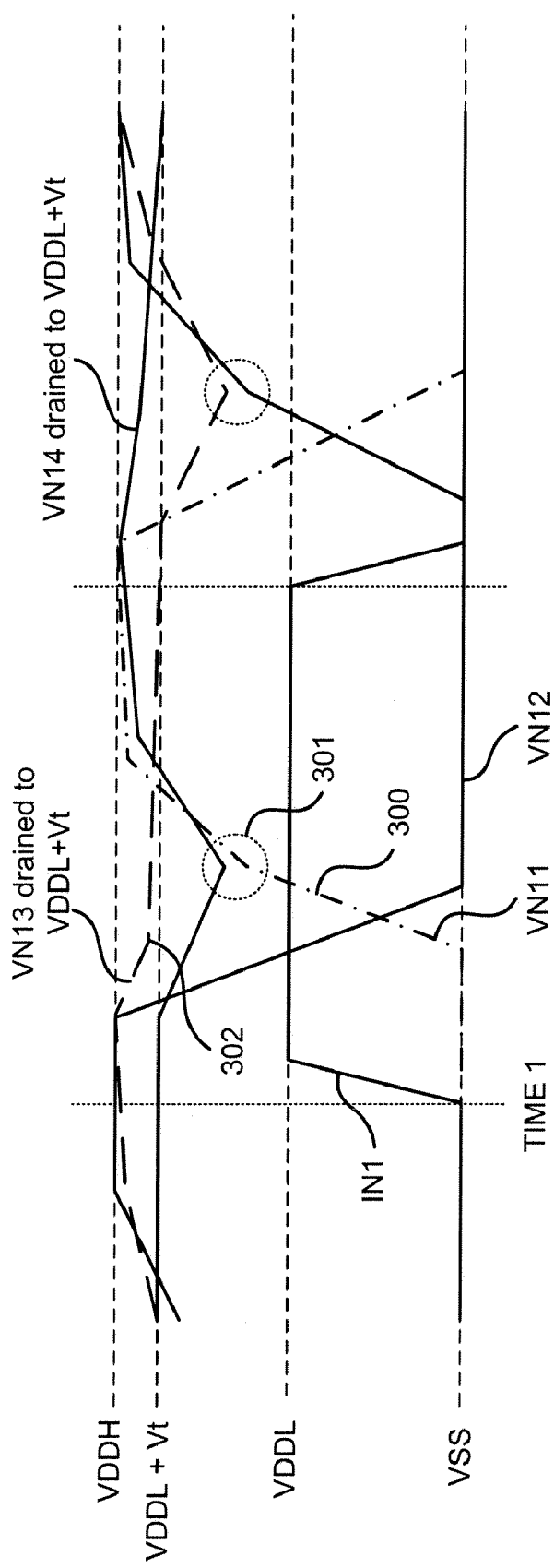
FIG. 3 is a waveform diagram illustrating signals in the circuit of FIG. 2.

Referring to FIG. 3, signal IN1 may transition from a logical 0 to a logical 1 (i.e. from voltage VSS to VDDL) at time TIME1 (see FIG. 3). Prior to time TIME1, transistor T11 is off and inverter 102 pulls node N10 to voltage VDDL, thereby turning on transistor T12, which in turn pulls node N11 to voltage VSS, which turns on transistor T13 and pulls node N12 to VDDH. Since node N12 is at voltage VDDH, inverter 104 pulls output signal OUT1 to voltage VSS. Also, since node N11 is at voltage VSS, inverter 106 pulls output signal OUT1' to voltage VDDH. (As used in FIG. 3, VN11, VN12, VN13 and VN14 refer to the voltages at nodes N11 N12, N13 and N14.)

Since node N12 is at voltage VDDH, transistor T14 is off, and since signal IN1 is low, transistor T15 is on. Transistor T17 is configured to function as a capacitor (e.g., the source and drain are coupled together to form a single terminal). Accordingly, the gate of transistor T17 charges to voltage VDDH via transistors T15 and T13. Since node N10 is at voltage VDDL and node N11 is at voltage VSS, transistor T16 is off. Transistor T18 is likewise configured to function as a capacitor, but its charge state remains unchanged. For reasons explained below, the gate of transistor T18 is charged to a voltage VDDL+VT, where VT is the threshold of transistor T16, which is around 0.4V typically.

State of Circuit 100 at Time TIME1

At time TIME1, signal IN1 goes to voltage VDDL, thereby turning on transistor T11, and causing inverter 102 to pull node N10 to voltage VSS, which in turn turns off transistor T12 and turns on transistor T16. When transistor T16 turns on, charge from the gate of transistor T18 flows to node N11, pulling node N11 high, and turning off transistor T13 (see portion 300 of waveform VN11). Because transistor T13 is shut off by the surge of charge from the gate of transistor T18, the contention between transistors T11 and T13 is minimized.

Because transistor T11 turns on and transistor T13 turns off, node N12 falls to voltage VSS and transistor T14 turns on, thereby pulling node N11 high (to VDDH). See portion 301 of waveform VN11. Since node N12 is at voltage VSS, inverter 104 raises output signal OUT1 to voltage VDDH. Because node N11 is at voltage VDDH, inverter 106 causes output signal OUT1' to go to voltage VSS.

As mentioned above, charge stored at the gate of transistor T18 pulls node N11 high when transistor T16 turns on. For reasons explained below, prior to transistor T16 turning on, node N14 is charged to a voltage equal to VDDL+VT, where VT is the threshold voltage of transistor T16. As soon as transistor T16 turns on, charge from the gate of transistor T18 flows and charges node N11 to a voltage VN11 as follows:

$$VN11=(VDDL+VT)CT18/(CT18+CN11)$$

where CT18 is the capacitance at the node comprising the gate of transistor T18 and the source of transistor T16, and CN11 is the capacitance at node N11 when transistors T16 and T12 are off. Voltage VN11 turns off transistor T13. Thereafter, the voltage at node N11 is brought all the way to VDDH as transistor T14 turns on. This, in turn, causes the capacitance at the gate of transistor T18 to be charged to voltage VDDH.

Also as mentioned above, because transistor T11 turns on and transistor T13 is off, node N12 is pulled low (to voltage VSS), thereby turning on transistor T14, which turns on and pulls node N11 high (to voltage VDDH). Because node N12 is low, inverter 104 brings signal OUT1 to voltage VDDH, and because node N11 is at voltage VDDH, inverter 106 brings signal OUT1' to voltage VSS.

As mentioned above, prior to time TIME1, voltage VN13 at the gate of transistor T17 is pulled to VDDH. After time TIME1, since signal IN1 is at VDDL, charge flows off of the gate of transistor T17 through transistor T15 until the voltage at the gate of transistor T17 equals VDDL+VT. At this point 302, transistor T15 turns off and the charge at the gate of transistor T17 remains at VDDL+VT. A similar mechanism is responsible for pulling the voltage at the gate of transistor T18 to VDDL+VT prior to time TIME1.

Figure 4:
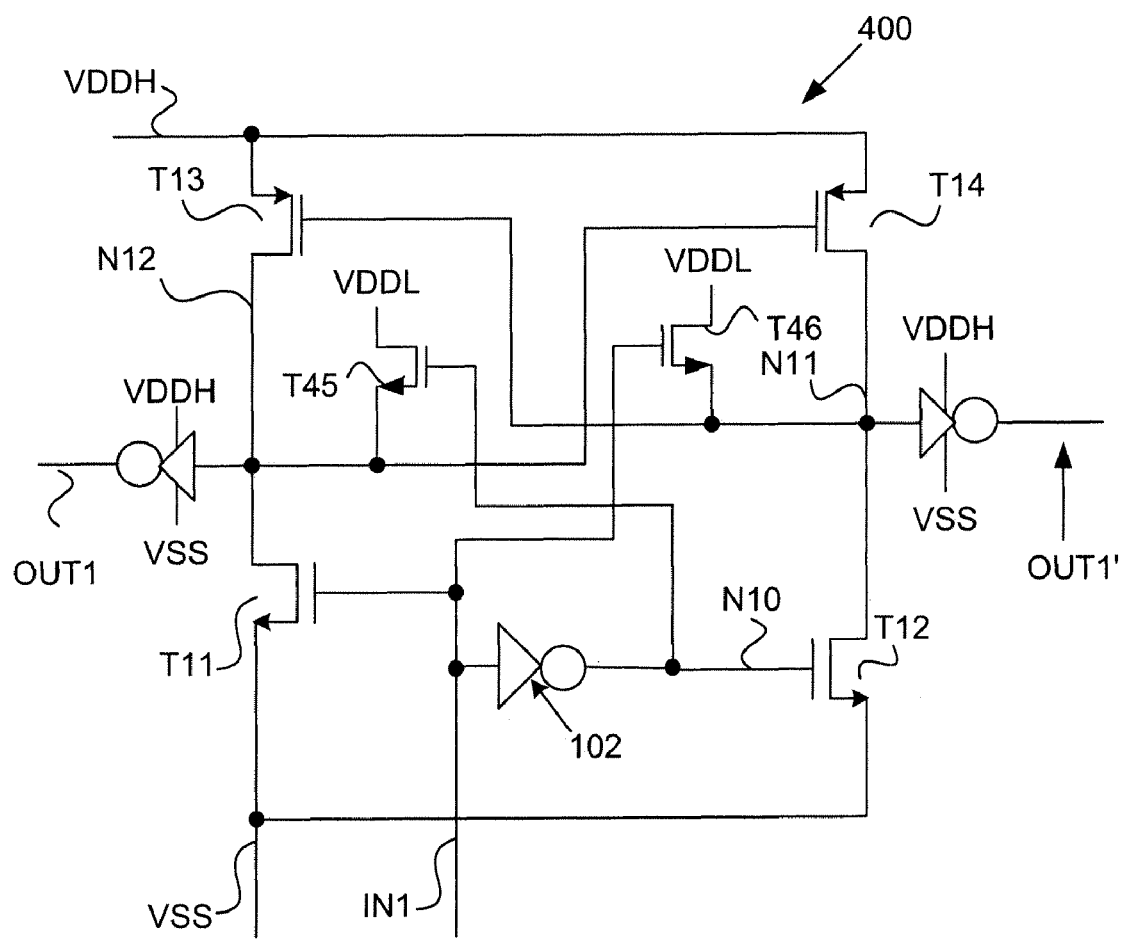
FIG. 4 illustrates a circuit constructed in accordance with another embodiment of the invention using P channel pull-up transistors, N channel pull-down transistors, and N channel transistors for coupling a voltage supply terminal to the control leads of the P channel pull-up transistors.

FIG. 4 illustrates an alternative embodiment of the present invention. Circuit 400 of FIG. 4 is similar to circuit 100 of FIG. 2. In this embodiment, instead of using PMOS transistors T15 and T16, circuit 400 employs NMOS transistors T45 and T46 coupled between nodes N12 and N11 and VDDL, respectively. Additionally, the drain of transistor T45 is coupled to receive voltage VDDH and the drain of transistor T46 is coupled to receive voltage VDDH, rather than using capacitors to stored the charge. Additionally, signal IN1 drives the gate of transistor T46, and inverter 102 drives the gate of transistor T45. The drive signals for T46 and T45 are changed because opposite polarity devices are used in this example.

Figure 5:
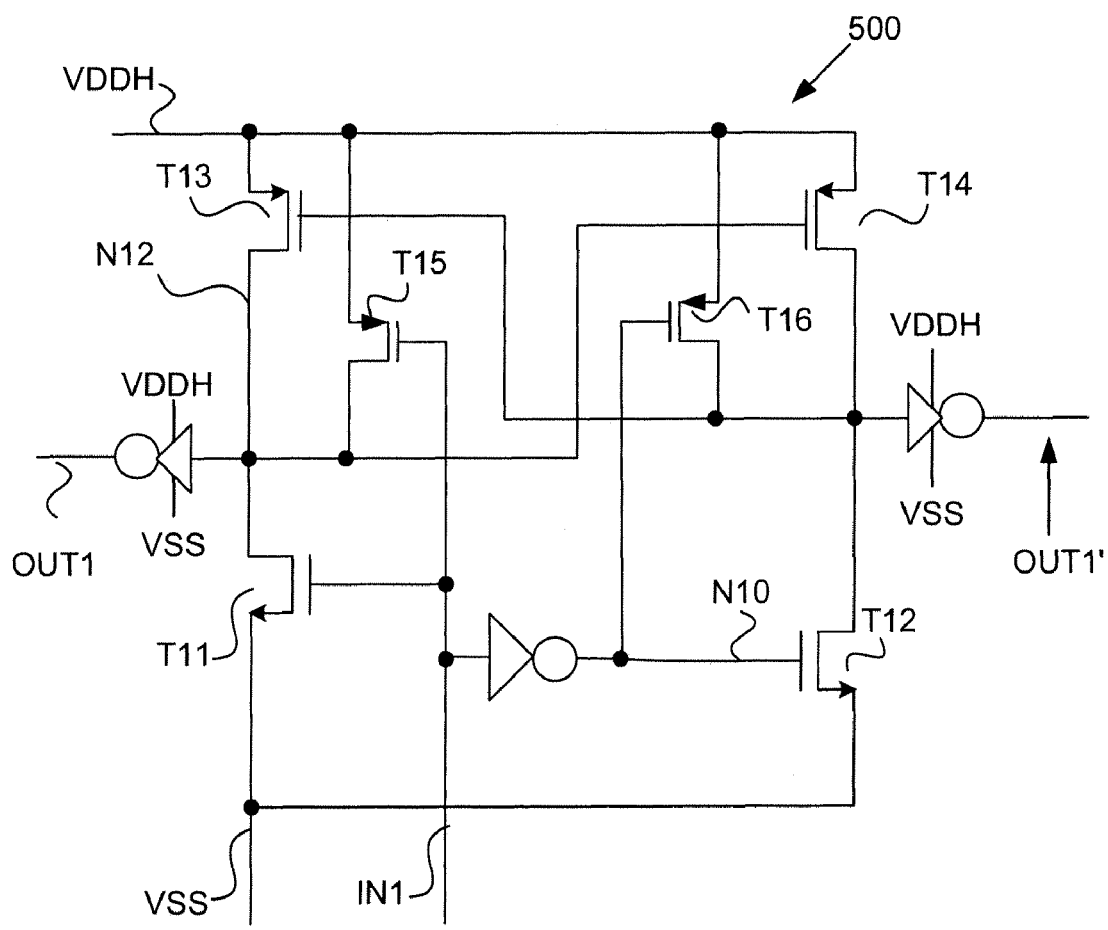
FIG. 5 illustrates a circuit constructed in accordance with another embodiment of the invention using P channel pull-up transistors, N channel pull-down transistors, and P channel transistors for coupling a voltage supply terminal to the control leads of the P channel pull-up transistors.

FIG. 5 illustrates an alternative embodiment of the present invention. Circuit 500 of FIG. 5 is similar to circuit 100 of FIG. 2. However, in this embodiment, instead of being coupled to capacitance set by transistor T17, the source of transistor T15 is coupled to receive voltage VDDH; and instead of being coupled to a likewise capacitance set by transistor T18, the source of transistor T16 is coupled to receive voltage VDDH.

Circuit 100 exhibits better delay (i.e. faster switching speed), lower power consumption, and can perform with a greater VDDH/VDDL ratio than typical prior art level shifters. Advantageously, PMOS transistors T15 and T16 provide fast response time.

Circuit 400 has the advantage of a complete shut-off for logic 0 at nodes N11 and N12. In contrast, in circuit 500, if VDDH exceeds VDDL by an amount exceeding the threshold voltage of transistors T15 and T16, there will be a DC path through transistors T15 and T11 when signal IN1 is high, and between transistors T16 and T12 when signal IN1 is low.

While the invention has been described with respect to specific embodiments, those skilled in the art will appreciate that changes can be made in form and detail without departing form the spirit and scope of the invention. For example, instead of using a MOS transistor gate to serve as part of a capacitive node as in circuit 400, a metal layer (or pair of metal layers) can be used to form the capacitive node. Also, different electronic elements can also be added to the circuit of the present invention. Also, instead of having the circuit convert first rail voltages VSS and VDDL to rail voltages VSS and VDDH, in some embodiments, the circuit converts voltages VSSH and VDD to VSSL and VDD. (VSSL is a lower voltage than VSSH.) Accordingly, all such changes come within the invention.

What is claimed is:

1. A circuit for converting an input signal having a first pair of rail voltages to an output signal having a second pair of rail voltages, said circuit comprising:
   an input lead for receiving said input signal;
   first and second transistors coupled in series between a first voltage supply lead and a second voltage supply lead;
   third and fourth transistors coupled in series between said first voltage supply lead and said second voltage supply lead, a control lead of said third transistor being coupled to a first node between said first and second transistors, a control lead of said first transistor being coupled to a second node between said third and fourth transistors, said second transistor turning on in response to said input signal transitioning from a first level to a second level, said fourth transistor turning on in response to said input signal transitioning from the second level to the first level;
   a fifth transistor coupling the control lead of said third transistor to a first charge source, the first charge source providing a first charge to turn off said third transistor when the fifth transistor is activated responsive to the input signal transitioning from said second level to said first level; and
   a sixth transistor coupling the control lead of said first transistor to a second charge source, the second charge source providing a second charge to turn off said first transistor when the sixth transistor is activated responsive to the input signal transitioning from said first level to said second level.

2. The circuit of claim 1 further comprising an inverter having an input coupled to the input lead and further coupled to a control lead of the second transistor, the inverter further having an output coupled to a control lead of the fourth transistor.

3. The circuit of claim 1 wherein the fifth transistor has a first terminal coupled to the control lead of the third transistor, a second terminal coupled to the first charge source, and a control lead coupled to the input signal, and wherein the sixth transistor has a first terminal coupled to the control lead of the first transistor, a second terminal coupled to the second charge source, and a control lead coupled to an inverse of the input signal.

4. The circuit of claim 1 wherein the first charge source comprises an MOS transistor having a gate coupled to the second terminal of the fifth transistor and a source terminal and a drain terminal coupled to a first voltage, and wherein the second charge source comprises an MOS transistor having a gate coupled to the second terminal of the sixth transistor and a source terminal and a drain terminal coupled to a second voltage.

5. The circuit of claim 1 wherein the fifth transistor has a first terminal coupled to the control lead of the third transistor, a second terminal coupled to a rail voltage, and a control lead coupled to the input signal, and wherein the sixth transistor has a first terminal coupled to the control lead of the first transistor, a second terminal coupled to the rail voltage, and a control lead coupled to an inverse of the input signal.

6. The circuit of claim 1 wherein the fifth transistor has a first terminal coupled to the control lead of the third transistor, a second terminal coupled to a rail voltage, and a control lead coupled to an inverse of the input signal, and wherein the sixth transistor has a first terminal coupled to the control lead of the first transistor, a second terminal coupled to the rail voltage, and a control lead coupled to the input signal.

7. The circuit of claim 1 wherein the fifth transistor couples a first capacitive node to the control lead of said third transistor, and the sixth transistor couples a second capacitive node to the control lead of said first transistor, said first capacitive node being charged through said fifth and first transistors when the fifth and first transistors are on, said second capacitive node being charged through said sixth and third transistors when said sixth and third transistors are on.

8. The circuit of claim 1 wherein the first charge source and second charge source comprise said first voltage supply lead, wherein the fifth transistor couples said first voltage supply lead to the control lead of said third transistor, and the sixth transistor couples the said first voltage supply lead to the control lead of said first transistor.

9. The circuit of claim 1 further comprising:
   a first inverter for receiving a first voltage at said first node and providing a first output signal at a first output lead;
   a second inverter for receiving a second voltage at said second node and providing a second output signal at a second output lead; and
   a third inverter for receiving said input signal, said third inverter controlling said fourth transistor, said input signal controlling said second transistor.

10. The circuit of claim 1 wherein the first and third transistors have a first conductivity type and the second and fourth transistors have a second conductivity type.

11. The circuit of claim 1 wherein the fifth and sixth transistors have said first conductivity type.

12. The circuit of claim 1 wherein the fifth and sixth transistors have said second conductivity type.

13. The circuit of claim 1 wherein the first pair of rail voltages comprise a first low voltage and a first high voltage and the second pair of rail voltages comprise a second low voltage and a second high voltage, wherein the first low voltage of said first pair of rail voltages equals the second low voltage of the second pair of rail voltages, the first high voltage of said first pair of rail voltages is less than the second high voltage of the second pair of rail voltages, wherein the first voltage supply lead receives the second high voltage of the second pair of rail voltages, and the second voltage supply lead receives the second low voltage of the second pair of rail voltages.

14. A system comprising the circuit of claim 1, said system further comprising:
   first circuitry using signals characterized by said first pair of rail voltages; and
   second circuitry using signals characterized by said second pair of rail voltages, wherein said circuit permits said first circuitry to communicate a signal to said second circuitry.

15. A method of level shifting a signal comprising:
   receiving an input signal, the input signal transitioning from a first voltage to a second voltage;
   on a transition of the input signal from the first voltage to the second voltage,
      activating a second transistor, wherein the second transistor is coupled in series with a first transistor between a first high voltage rail and a first low voltage rail;
      deactivating a fourth transistor, wherein the fourth transistor is coupled in series with a third transistor between the first high voltage rail and the first low voltage rail, wherein a control lead of the third transistor is coupled to a first node between said first and second transistors and a control lead of the first transistor is coupled to a second node between the third and fourth transistors; and
      activating a sixth transistor, the sixth transistor coupling the control lead of the first transistor to a second charge source, and in accordance therewith, the second charge source providing a second charge to turn off said first transistor, and on a transition of the input signal from the second voltage to the first voltage, activating the fourth transistor;

deactivating the second transistor; and activating a fifth transistor, the fifth transistor coupling the control lead of the third transistor to a first charge source, and in accordance therewith, the first charge source providing a first charge to turn off said third transistor.

16. The method of claim 15 wherein the first charge source comprises a first capacitance, wherein a voltage on the first charge source is stored on the first capacitance when said input signal is at said first voltage, and wherein the second charge source comprises a second capacitance, wherein a voltage on the second charge source is stored on the second capacitance when said input signal is at said second voltage.

17. The method of claim 15 wherein the first and second charge sources are charged to the first high voltage rail or a second high voltage rail less than said first high voltage rail.

18. The method of claim 15 wherein the sixth transistor is activated by the input signal and wherein the fifth transistor is activated by an inverse of the input signal.

19. The method of claim 15 wherein the fifth transistor is activated by the input signal and wherein the sixth transistor is activated by an inverse of the input signal.

20. The method of claim 15 wherein the second voltage is equal to a second high voltage rail, and wherein first high voltage rail is greater than the second high voltage rail.

21. The apparatus of claim 1, wherein:

said first transistor turns on in response to said input signal transitioning from the second level to the first level after the first charge turns off said third transistor; and said third transistor turns on in response to said input signal transitioning from the first level to the second level after the second charge turns off said first transistor.

* * * * *